United States Patent [19]

Allen et al.

[11] Patent Number: 5,580,694
[45] Date of Patent: Dec. 3, 1996

[54] PHOTORESIST COMPOSITION WITH ANDROSTANE AND PROCESS FOR ITS USE

[75] Inventors: Robert D. Allen; Richard A. DiPietro, both of San Jose; Gregory M. Wallraff, Morgan Hill, all of Calif.

[73] Assignee: International Business Machines Corporation, Armonk, N.Y.

[21] Appl. No.: 266,044

[22] Filed: Jun. 27, 1994

[51] Int. Cl.$^6$ .............................. G03C 1/492; G03C 5/00
[52] U.S. Cl. .................. 430/270.1; 430/325; 430/326; 430/910
[58] Field of Search .................................. 430/910, 270, 430/270.1, 326, 325

[56] References Cited

U.S. PATENT DOCUMENTS

| | | | |
|---|---|---|---|
| 4,500,461 | 2/1985 | VanRheenen | 260/397.45 |
| 4,666,820 | 5/1987 | Chandross et al. | 430/270 |
| 4,672,020 | 6/1987 | Koelsch et al. | 430/166 |
| 4,983,501 | 1/1991 | Ruckert | 430/326 |
| 5,045,431 | 9/1991 | Allen et al. | 430/270 |
| 5,071,730 | 12/1991 | Allen et al. | 430/270 |
| 5,252,427 | 10/1993 | Bauer et al. | 430/270 |
| 5,310,619 | 5/1994 | Crivello et al. | 430/270 |
| 5,332,648 | 7/1994 | Kihara et al. | 430/270 |
| 5,338,818 | 8/1994 | Brunsvold et al. | 430/270 X |
| 5,372,912 | 12/1994 | Allen et al. | 430/270 |

OTHER PUBLICATIONS

H. Sugiyama, K. Ebata, A. Mizushima, and K. Nate, Positive Excimer Laser Resists Prepared with Aliphatic Diazoketones, Proceedings SPE: Photopolymer: Principls, Processes and Materials, Mid Hudson Section A88, pp. 51–61.

Robert D. Allen et al., "Designing High Performance KrF and ArF Single Layer Resists with Methacrylate Polymers", Journal of Photopolymer Science and Technology, vol. 6, No. 4, 1993, pp. 575–591.

E. Gipstein et al., "Evaluation of Pure Novolak Cresol–Formaldehyde Resins for Deep U.V. Lithography", Journal of the Electrochemical Society, vol. 129, No. 1, Jan. 1982, pp. 201–204.

Yuko Kaimoto et al., "Alicyclic Polymer for ArF and KrF Excimer Resist Based on Chemical Amplification", SPIE, vol. 1672, 1992, pp. 66–73.

Michael J. O'Brien, "Novolac–based Photoresists Combining Chemical Amplification and Dissolution Inhibition", Polymer Engineering and Science, vol. 29, No. 13, Mid–Jul. 1989, pp. 846–849.

E. Reichmanis et al., "A Novel Approach to o–nitrobenzyl Photochemistry for Resists", Journal of Vacuum Science Technology, vol. 19, No. 4, Nov./Dec. 1981, pp. 1338–1342.

G. M. Wallraff et al., "A Chemically Amplified Photoresist for Visible Laser Direct Imaging", Journal of Imaging Science and Technology, vol. 36, No. 5, Sep./Oct. 1992, pp. 468–476.

Primary Examiner—George F. Lesmes
Assistant Examiner—Bernard P. Codd
Attorney, Agent, or Firm—Robert B. Martin

[57] ABSTRACT

The present invention relates to a radiation-sensitive resist composition comprising (a) a radiation-sensitive acid generator, (b) a substituted androstane, and (c) a copolymer binder. The copolymer binder comprises (meth)acrylic/(meth)acrylate copolymer.

6 Claims, No Drawings

5,580,694

PHOTORESIST COMPOSITION WITH ANDROSTANE AND PROCESS FOR ITS USE

TECHNICAL FIELD

The present invention relates to an improved lithographic photoresist composition for use in the manufacture of integrated circuits.

BACKGROUND OF THE INVENTION

There is a desire in the industry for higher circuit density in microelectronic devices which are made using lithographic techniques. One method of increasing the number of components per chip is to decrease the minimum feature size on the chip, which requires higher lithographic resolution. The use of shorter wavelength radiation (e.g., deep UV, e.g., 190–315 nm) than the currently employed mid-UV spectral range (e.g., 350–450 nm) offers the potential for higher resolution. However, with deep UV radiation, fewer photons are transferred for the same energy dose and higher exposure doses are required to achieve the same desired photochemical response. Further, current lithographic tools have greatly attenuated output in the deep UV spectral region.

Commercially-available lithographic positive, radiation-sensitive resist compositions generally contain an alkali-soluble phenol-formaldehyde novolac resin and an o-naphthoquinone diazide which decomposes on exposure to radiation to form an indenecarboxylic acid. Unfortunately, novolac resin and the diazide are strongly absorbing in the deep UV, especially at the lower deep UV (e.g., 193 nm), thereby making the composition unsuitable for use as a resist in the deep UV.

Reichmanis et al., "A Novel Approach to O-nitrobenzyl Photochemistry for Resists", Journal of Vacuum Science Technology, Vol. 19, No. 4, 1981, disclose a two-component deep UV resist comprising (i) a copolymer of methyl methacrylate and methacrylic acid, and (ii) a member of the family of o-nitrobenzyl carboxylates including o-nitrobenzyl cholate. Although these resists are generally transparent in the deep UV, they require high exposure doses which are unsuitable in a commercial environment.

It is therefore an object of the present invention to provide a radiation-sensitive resist composition for use in the deep UV which has improved sensitivity and resolution.

Other objects and advantages will become apparent from the following disclosure.

SUMMARY OF THE INVENTION

The present invention relates to a chemically-amplified, radiation-sensitive resist composition comprising (a) a radiation-sensitive acid generator; (b) a substituted androstane; and (c) a copolymer comprising the reaction product of (i) acrylic acid, methacrylic acid, or mixtures thereof; and (ii) methacrylate, acrylate, or mixtures thereof. Preferably, the copolymer has acid labile pendant groups. The radiation-sensitive resist composition of the present invention provides improved sensitivity in the deep UV. The present invention also relates to the use of the resist composition to make integrated circuits.

A more thorough disclosure of the present invention is presented in the detailed description which follows.

DESCRIPTION OF THE PREFERRED EMBODIMENT

The present invention relates to a positive tone, radiation-sensitive composition comprising (a) a radiation-sensitive acid generator; (b) a substituted androstane; and (c) a copolymer comprising the reaction product of (i) acrylic acid, methacrylic acid, or mixtures thereof; and (ii) alkyl methacrylate, alkyl acrylate, or mixtures thereof.

The copolymer in the resist composition is the reaction product of a plurality of monomers. The first monomer is selected from acrylic acid or methacrylic acid, or mixtures thereof. The preferred monomer is methacrylic acid. The acid monomer contributes to the dissolution enhancing property of the copolymer. A second monomer is selected from alkyl acrylate, alkyl methacrylate, or mixtures thereof. Various types of alkyl ester of these monomers can be used to synthesize the copolymer. Suitable alkyl esters are methyl, ethyl, t-butyl, and alicyclic.

The preferred copolymer comprises an acid monomer and three alkyl ester monomers. Preferably, the copolymer will comprise a lower alkyl ester monomer such as methyl or ethyl ester monomer. The copolymer will also preferably comprise a monomer having an acid labile ester group. This monomer provides acid-sensitive ester groups pendant on the copolymer backbone. The preferred acid labile pendant groups are organic ester groups which undergo a cleavage reaction in the presence of an acid. Preferred ester groups are tertiary alkyl esters such as t-butyl esters of carboxylic acids. However, it is understood that a wide range of acid labile groups are operative in the invention. For instance, additional acid-sensitive groups are listed in H. Ito et al., U.S. Pat. No. 4,491,628, "Positive- and Negative-working Resist Compositions with Acid Generating Photoinitiator and Polymer with Acid Labile Groups Pendant From Polymer Backbone", the disclosure of which is incorporated herein by reference. Preferred monomers useful in the practice of the present invention include the t-butyl esters of acrylates and methacrylates. The monomer with the acid labile ester group, in combination with the radiation-sensitive acid generator, contributes radiation sensitivity to the composition. The copolymer also preferably comprises alicyclic ester monomers, preferably having a saturated ester substituent (e.g., adamantanemethyl, isobornyl, and norbornyl) to provide enhanced etch resistance.

The copolymer of the present invention will generally comprise about 1–30 weight % (preferably about 10–20 weight %) of the acrylic acid, methacrylic acid, or mixtures thereof component; about 35–65 weight % (preferably about 50–60 weight %) of the methacrylate, acrylate, or mixtures thereof component; and about 15–50 weight % (preferably about 20–40 weight %) of the monomer with acid labile group component. The choice of the specific monomers and their weight percent in a copolymer is varied depending upon the properties desired in the copolymer. For example, by varying the amount of the methacrylic acid component in the copolymer, the dissolution enhancement/inhibition property of the copolymer can be optimized without varying the amount of the copolymer in the composition. The radiation sensitivity of the copolymer can be varied by varying the amount of the methacrylic acid component and the monomer component with the acid labile group. Lastly, the glass transition temperature can be varied to some extent by varying the amount of the acrylate component and the methacrylic acid component in the copolymer. The copolymer will generally comprise about 50–90 weight % of the resist composition.

The copolymer can be synthesized by standard free radical solution polymerization techniques known by those skilled in the art. Suitable copolymers are disclosed in Allen et al., U.S. Pat. Nos. 5,045,431 and 5,071,730, the disclosures of which are incorporated herein by reference.

The second and key component of the resist composition is a mono-, di-, or tri-protected hydroxy androstane-17-alkylcarboxylate. The protected hydroxy is a hydroxy substituent where hydrido is replaced with a nonphotoactive substituent such as lower ($C_{1-4}$) alkylcarbonyl such as methylcarbonyl, or lower ($C_{1-4}$) haloalkylcarbonyl such as trihalo (fluoro) methylcarbonyl. Suitable nonphotoactive protected hydroxy substituents are acetyl and trifluoroacetyl. The androstane has 1 to 3 protected hydroxy substituents, preferably at the 3, 7, and 12 position, preferably at the 3 position. The term "alkylcarboxylate" as used herein is a tertiary alkoxycarbonylalkyl having the formula:

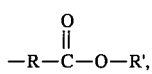

wherein R is lower ($C_{1-10}$) straight or branched alkyl and R' is lower ($C_{4-8}$) tertiary alkyl. The alkylcarboxylate ester substituent is at the 17 position. Photogenerated free acid causes cleavage of the alkylcarboxylate ester to form free acid, converting the androstane molecule from dissolution inhibitor to dissolution enhancer.

Suitable substituted androstanes for use in the process of the present invention are represented by the formula

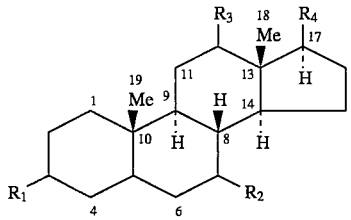

wherein $R_1$, $R_2$, and $R_3$ are hydrido, lower alkyl ($C_{1-4}$) carbonyloxy, or lower haloalkyl ($C_{1-4}$) carbonyloxy and $R_4$ is tertiary alkyoxycarbonylalkyl, preferably lower ($C_{4-8}$) tertiary alkoxycarbonyl lower ($C_{1-10}$) alkyl.

Preferably $R_2$ and $R_3$ are hydrido and $R_1$ is lower haloalkyl carbonyloxy, preferably lower fluoroalkyl carbonyloxy, and more preferably lower perfluoroalkyl carbonyloxy.

Preferred compounds are lithocholates having the hydroxy group protected with a protecting substituent such as acetyl and fluoroacetyl substituent. Specific preferred compounds are: tertiary alkyl-(3-alkyl or haloalkyl carbonyl)lithocholate such as t-butyl 3-acetyllithocholate and t-butyl 3-trifluoroacetyllithocholate.

The third component of the resist composition is a photosensitive acid generator. Upon exposure to radiation, the radiation-sensitive acid generator generates a strong acid. Suitable acid generators include triflates (e.g., triphenylsulfonium triflate or bis-(t-butyl phenyl) iodonium triflate), pyrogallol (e.g., trimesylate of pyrogallol), onium salts such as triarylsulfonium and diaryl iodonium hexafluorantimonates, hexafluoroarsenates, trifluoromethane sulfonates and others; trifluoromethanesulfonate esters of hydroxyimides, alpha-alpha'-bis-sulfonyl diazomethanes, sulfonate esters of nitro-substituted benzyl alcohols and napthoquinone-4-diazides and alkyl disulfones. Other suitable photoacid generators are disclosed in Allen's patent above and Reichmanis et al., review article (*Chemistry of Materials*, Vol. 3, page 395, 1991), the disclosures of which are incorporated herein by reference.

The three-component resist composition preferably comprises about 1–10 weight % of the acid generator, about 10–40 weight % of the substituted androstane, about 50–90 weight % of the copolymer, more preferably about 1–5 weight % of the acid generator, about 15–30 weight % of the substituted androstane, and the remaining as copolymer.

The present invention also relates to a process for generating a resist image on a substrate comprising the steps of: (a) coating a substrate with a film comprising the resist composition of the present invention, (b) imagewise exposing the film to radiation, and (c) developing the image.

The first step involves coating the substrate with a film comprising the resist composition dissolved in a suitable solvent. Suitable substrates are comprised of silicon. Suitably, the surface of the substrate is cleaned by standard procedures before the film is disposed thereon. Suitable solvents for the composition include cyclohexanone or propylene glycol methyl ether acetate (PGMEA). Surprisingly, the compositions of the present invention having fluorinated protected hydroxy substituents have enhanced solubility in PGMEA, which is a standard solvent in the industry. The film can be coated on the substrate using art-known techniques such as spin or spray coating, or doctor blading. Preferably, before the film has been exposed to radiation, the film is heated to an elevated temperature of about 90°–150° C. for a short period of time of about 1 minute. The dried film has a thickness of about 0.5–5.0 microns, preferably about 0.6–1.2 microns. In the second step of the process, the film is imagewise exposed to radiation, suitably electron beam or electromagnetic, preferably electromagnetic radiation such as ultraviolet or X-ray, more preferably ultraviolet radiation suitably at a wavelength of about 190–250 nm (248/254 nm), preferably 193 nm. Suitable radiation sources include mercury, mercury/xenon, and xenon lamps, X-ray or E-beam. The preferred radiation source is ArF excimer or KrF excimer. Conveniently, due to the enhanced radiation sensitivity of the resist film, a resist film (1 micron thickness) is fully exposed with less than about 35 mJ/cm$^2$ of radiation, more preferably less than about 25 mJ/cm$^2$, preferably less than about 20 mJ/cm$^2$ of radiation, more preferably less than about 15 mJ/cm$^2$ of radiation. The radiation is absorbed by the radiation-sensitive acid generator to generate free acid which causes cleavage of the androstane ester and formation of the corresponding acid. The cleavage of the ester converts the androstane from dissolution inhibitor to dissolution enhancer, thereby increasing the solubility of the exposed resist composition in an aqueous base to achieve patterned dissolution differentiation. Preferably, after the film has been exposed to radiation, the film is again heated to an elevated temperature of about 90°–150° C. for a short period of time of about 1 minute.

The third step involves development of the image with a suitable solvent. Suitable solvents include an aqueous base, preferably an aqueous base without metal ions such as tetramethyl ammonium hydroxide or choline. The resist composition of the present invention has high radiation sensitivity and provides positive images with high contrast and straight walls. Uniquely, the dissolution property of the composition of the present invention can be varied by simply varying the composition of the copolymer and/or the structure of the androstane. Because both the copolymer and the substituted androstane have a very low optical density in the deep UV, the resist composition is uniquely suitable for use in the deep UV, especially at 193 nm. The androstane component also provides greatly enhanced etch resistance for subsequent process steps.

The composition of the present invention may be used to make an integrated circuit assembly, such as an integrated circuit chip, multichip module, or circuit board. The integrated circuit assembly comprises a circuit formed on a substrate by the steps of: (a) coating a substrate with a film comprising the resist composition of the present invention, (b) imagewise exposing the film to radiation, (c) developing the image to expose the substrate, and (d) forming the circuit in the developed film on the substrate by art-known techniques.

After the substrate has been exposed, circuit patterns can be formed in the exposed areas by coating the substrate with a conductive material such as conductive metals by art-known dry-etching techniques such as evaporation, sputtering, plating, chemical vapor deposition, or laser-induced deposition. The surface of the film can be milled to remove any excess conductive material. Dielectric materials may also be deposited by similar means during the process of making circuits. Inorganic ions such as boron, phosphorous, or arsenic can be implanted in the substrate in the process for making p or n doped circuit transistors. Other means for forming circuits are well known to those skilled in the art.

The following examples are detailed descriptions of methods of preparation and use of certain compositions of the present invention. The detailed preparations fall within the scope of, and serve to exemplify, the more generally described methods set forth above. The examples are presented for illustrative purposes only, and are not intended as a restriction on the scope of the invention.

EXAMPLE I

Resist Performance

Three resist compositions were prepared, each having 1.0 weight % of the photoaaid generator bis (t-butylphenyl) iodonium triflate and the following additional components:

Composition 1: 99 weight % of the copolymer (50% methylmethacrylate, 28% t-butyl methacrylate, 22% methacrylic acid).

Composition 2: 25 weight % of t-butyl cholate and 74 weight % of the copolymer.

Composition 3: 25 weight % of the t-butyl 3-acetyllithocholate and 74 weight % of the copolymer.

Composition 4: 25 weight % of the t-butyl 3-trifluoroacetyllithocholate and 74 weight % of the copolymer.

Each of the compositions was dissolved in cyclohexanone and spin coated as a 1 micron film on a silicon substrate. The films were then baked at 110° C. for 60 seconds. A portion of each film was then exposed at 254 nm with a dose of about 25 mJ/cm$^2$. The film was baked again at 110° C. for 60 seconds. The film was then developed with 0.1N aqueous tetramethyl ammonium hydroxide. Dissolution rates were measured to give the following results:

| (Dissolution Rate: R - exposed; $R_0$ unexposed) | | | |
|---|---|---|---|
| Composition | R (Å/min) | $R_0$ (Å/min) | $R/R_0$ |
| 1 | — | — | 6.3 |
| 2 | 23 | 2.6 | 8.8 |
| 3 | 25 | 0.53 | 47.2 |
| 4 | 35 | 0.25 | 140 |

EXAMPLE 2

A resist formulation containing 74% of an aqueous base soluble methacrylate polymer containing methyl methacrylate, t-butyl methacrylate, and methacrylic acid, 25% of t-butyl 3-acetyllithocholate, and 1% of bis(t-butylphenyl) iodonium triflate was spin coated on a cleaned silicon wafer from cyclohexanone. After baking at 130° C. for 2 minutes to dry the film, the resist was exposed to 10 mJ/cm$^2$ of 193 nm light using an experimental ArF excimer stepper. The film was baked after exposure (104° C./1 minute) and developed for 20 seconds in an aqueous base (0.01N TMAH). Features as small as 0.20 microns were produced, with near-vertical sidewalls.

EXAMPLE 3

A resist formulation containing 79% of an aqueous base soluble methacrylate polymer containing isobornyl methacrylate, methyl methacrylate, t-butyl methacrylate, and methacrylic acid, 20% of t-butyl trifluoroacetyllithocholate, and 1% of bis(t-butylphenyl) iodonium triflate was spin coated on a cleaned silicon wafer from propylene glycol methyl ether acetate. After baking at 125° C. for 2 minutes to remove solvent, the resist was exposed to a range of doses (at 250 nm) from 0 to 10 mJ/cm$^2$. After a post-expose bake (125° C./1 minute), the film was developed in 0.21N TMAH (tetramethyl ammonium hydroxide). The ratio of exposed-to-unexposed dissolution rate ($R/R_0$) is very high (>240) as R=24 μm/min and $R_0$ is less than 0.1 μm/min. Contrast in this system (slope of film thickness v. expose dose) is 10.

EXAMPLE 4

A resist formulation containing 79% of an aqueous base soluble methacrylate polymer containing isobornyl methacrylate, methyl methacrylate, and methacrylic acid, 20% of t-butyl trifluoroacetyllithocholate, and 1% of bis(t-butylphenyl) iodonium triflate was spin coated on a cleaned silicon wafer from propylene glycol methyl ether acetate. After baking at 125° C. for 2 minutes to remove solvent, the resist was exposed to a range of doses (at 250 nm) from 0 to 10 mJ/cm$^2$. After a post-expose bake (125° C./1 minute), the film was developed in 0.1N TMAH. The ratio of exposed-to-unexposed dissolution rate ($R/R_0$) is 70 (R=5.6 μm/min, $R_0$=0.08 μm/min). A contrast of 6 was observed.

Although this invention has been described with respect to specific embodiments, the details thereof are not to be construed as limitations for it will be apparent that various embodiments, changes, and modifications may be resorted to without departing from the spirit and scope thereof, and it is understood that such equivalent embodiments are intended to be included within the scope of this invention.

What is claimed is:

1. A resist composition comprising a radiation-sensitive acid generator, androstane-17-alkylcarboxylate having 1 to 3 ($C_{1-4}$) fluoroalkyl carbonyloxy substituents, and a copolymer comprising the reaction product of:
    (a) a monomer selected from acrylic acid or methacrylic acid; and
    (b) a monomer selected from methacrylate or acrylate.

2. The composition of claim 1 wherein the androstane is tertiary alkyl (($C_{1-4}$)fiuoroalkyl carbonyllithocholate).

3. The composition of claim 2 wherein the androstane is t-butyl trifluoroacetyllithocholate.

4. A process for generating a resist image on a substrate comprising the steps of:
    (a) coating a substrate with a film comprising a radiation-sensitive acid generator, androstane-17-alkylcarboxylate having 1 to 3 ($C_{1-4}$) fluoroalkyl carboxyloxy substituents, and a copolymer comprising the reaction product of:
        (i) a monomer selected from acrylic or methacrylic acid, and
        (ii) a monomer selected from methacrylate or acrylate;
    (b) imagewise exposing the film to electromagnetic radiation to form a latent image; and
    (c) developing the image to expose the substrate.

5. The process of claim 4 wherein the androstane is tertiary alkyl (($C_{1-4}$)fluoroalkyl carbonyllithocholate).

6. The process of claim 5 wherein the androstane is t-butyl 3-trifluoroacetyllithocholate.

* * * * *